US006506490B1

(12) United States Patent
Yamamoto

(10) Patent No.: US 6,506,490 B1
(45) Date of Patent: Jan. 14, 2003

(54) PRESSURE-SENSITIVE ADHESIVE SHEETS FOR DICING

(75) Inventor: Shouji Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 111 days.

(21) Appl. No.: 09/642,664

(22) Filed: Aug. 22, 2000

(30) Foreign Application Priority Data

Sep. 6, 1999 (JP) ............................................. 11-252351

(51) Int. Cl.[7] ............................ B32B 7/12; B22B 15/04; C09J 7/02
(52) U.S. Cl. ..................... 428/343; 428/345; 428/354
(58) Field of Search ................................. 428/343, 345, 428/354

(56) References Cited

U.S. PATENT DOCUMENTS

| 4,143,858 A | 3/1979 | Schmidt, III et al. |
| 5,512,625 A | 4/1996 | Butterbach et al. |
| 5,538,771 A | 7/1996 | Nakayama et al. |

FOREIGN PATENT DOCUMENTS

| EP | 0 715 341 A1 | 6/1996 |
| EP | 0 911 149 A2 | 4/1999 |
| EP | 0 911 149 A3 | 4/1999 |
| WO | WO 92/13901 | 8/1992 |

OTHER PUBLICATIONS

JP 2–305878 A—Abstract (Dec. 19, 1990).
JP 63–181347 A—Abstract (Jul. 26, 1988).
Singapore Search Report dated Sep. 28, 2001 (with attached report from Austrian Patent Office—Sep. 14, 2001).
European Search Report.

Primary Examiner—Daniel Zirker
Assistant Examiner—Victor Chang
(74) Attorney, Agent, or Firm—Sughrue Mion, PLLC

(57) ABSTRACT

A pressure-sensitive adhesive sheet for dicing is disclosed which can prevent the generation of a fibrous waste during dicing without having a decrease in product quality or a disadvantage in cost. The pressure-sensitive adhesive sheet for dicing comprises a substrate film and formed thereon a pressure-sensitive adhesive layer for adhesively fixing a material to be diced, wherein the substrate film has a single- or multilayer structure wherein at least the layer thereof in contact with the pressure-sensitive adhesive layer comprises a semi- or non-compatibilized polymer blend comprising two or more polymers. At least one of the polymers constituting the polymer blend may be a highly crystalline olefin resin having a crystallinity of 40% or higher and the content of this polymer in the polymer blend may be from 1 to 50% by weight. Furthermore, at least one of the polymers constituting the polymer blend may be a lowly crystalline olefin resin having a crystallinity lower than 40% and the content of this polymer in the polymer blend may be from 50 to 99% by weight.

10 Claims, 1 Drawing Sheet

PRESSURE-SENSITIVE ADHESIVE SHEETS FOR DICING

FIELD OF THE INVENTION

The present invention relates to pressure-sensitive adhesive sheets for dicing which are used for fixing a material to be cut such as a semiconductor wafer in cutting and separating (dicing) a semiconductor wafer or the like into small element pieces.

BACKGROUND OF THE INVENTION

Wafers of a semiconductor such as silicon, gallium or arsenic are produced so as to have a large diameter, cut and separated (diced) into small element pieces, and then sent to a mounting step. In this procedure, such a semiconductor wafer in the sate of adhering to a pressure-sensitive adhesive sheet is subjected to the steps of dicing, cleaning, expanding, pickup, and mounting. For the steps of from semiconductor wafer dicing to pickup, a pressure-sensitive adhesive sheet obtained by applying a pressure-sensitive adhesive to a substrate comprising a plastic film has been used.

In the dicing step, the wafer is cut with a rotating disk blade. The cutting technique which is coming to be mainly used for this dicing is the technique called full cutting, in which cutting is conducted to an inner part of the pressure-sensitive adhesive sheet maintaining the wafer. In the full cutting, since cutting is conducted up to an inner part of the sheet, the plastic film itself comes into a molten state due to its frictional heat to generate a fibrous waste of the plastic film itself on the dicing line after dicing. When this fibrous waste adheres to side walls or other parts of the chips, a problem arises that the adhered fibrous waste is mounted and encapsulated as it is in later steps to considerably reduce the reliability of the resulting semiconductor elements.

Means for eliminating such a problem have been proposed. For example, JP-A-5-156214 (the term "JP-A" as used herein means an "unexamined published Japanese patent application") proposes using an ethylene/methacrylate copolymer as a substrate. Although this technique is effective in reducing the generation of a fibrous waste in some degree, the diminution of waste generation attainable with this technique is insufficient for the dicing which will be required for highly reliable semiconductors. JP-A-5-211234 proposes using a substrate film which has been irradiated with a radiation, e.g., electron beams or γ-rays, in a dose of from 1 to 80 Mrad. However, this technique is undesirable in quality and cost because not only the irradiation causes considerable film damage, making it difficult to obtain a film having a satisfactory appearance, but also the film production is highly costly. Furthermore, JP-A-11-43656 proposes a pressure-sensitive adhesive sheet comprising a non-stretched polypropylene layer and a pressure-sensitive adhesive layer formed thereon. However, since the non-stretched polypropylene substrate tends to tear during expansion, the proposed pressure-sensitive adhesive sheet can be used only under expansion conditions such that substrate tearing does not occur. The proposed technique is hence not sufficiently suitable for general use in dicing.

SUMMARY OF THE INVENTION

The present invention has been made to overcome the problems of conventional techniques described above.

Accordingly, one object of the present invention is to provide a pressure-sensitive adhesive sheet for dicing which can prevent the generation of a fibrous waste during dicing without having a decrease in product quality or a disadvantage in cost.

Another object of the present invention is to provide a pressure-sensitive adhesive sheet for dicing which not only can prevent the generation of a fibrous waste during dicing but has flexibility which enables the pressure-sensitive adhesive sheet to fully cope with various expansion conditions.

As a result of intensive studies in order to accomplish the above objects, it has been found that the generation of a fibrous waste during dicing can be prevented by using a substrate film constituted of a specific polymer blend comprising two or more polymers. The present invention has been completed based on this finding.

The present invention provides a pressure-sensitive adhesive sheet for dicing which comprises a substrate film and formed thereon a pressure-sensitive adhesive layer for adhesively fixing a material to be diced, wherein the substrate film has a single- or multilayer structure and at least a layer in the substrate film, which contacts the pressure-sensitive adhesive layer comprises a semi- or non-compatibilized polymer blend comprising two or more polymers. Hereinafter, this pressure-sensitive adhesive sheet for dicing is sometimes referred to as a "pressure-sensitive adhesive sheet 1".

In the preferred embodiment of the pressure-sensitive adhesive sheet 1, at least one of the polymers constituting the polymer blend is a highly crystalline olefin resin having a crystallinity of 40% or higher and the content of this polymer in the polymer blend is 1 to 50% by weight based on the weight of the polymer blend. Further, at least one of the polymers constituting the polymer blend is a lowly crystalline olefin resin having a crystallinity lower than 40% and the content of this polymer in the polymer blend is 50 to 99% by weight based on the weight of the polymer blend.

The present invention further provides a pressure-sensitive adhesive sheet for dicing which comprises a substrate film and formed thereon a pressure-sensitive adhesive layer for adhesively fixing a material to be diced, wherein the substrate film has a single- or multilayer structure and at least a layer in the substrate film, which contacts the pressure-sensitive adhesive layer comprises a polymer blend comprising a lowly crystalline polymer having a crystallinity lower than 40% and a highly crystalline polymer having a crystallinity of 40% or higher. Hereinafter, this pressure-sensitive adhesive sheet is sometimes referred to as a "pressure-sensitive adhesive sheet 2".

In the preferred embodiment of the pressure-sensitive adhesive sheet 2, the contents of the lowly crystalline polymer and the highly crystalline polymer in the polymer blend are 50 to 99% by weight and 1 to 50% by weight, respectively.

Further, in the pressure-sensitive adhesive sheet 1 or 2, the pressure-sensitive adhesive layer may be, for example, a radiation-curable pressure-sensitive adhesive layer.

The mechanism of the generation of a fibrous waste during dicing is presumed to be probably as follows. In dicing a wafer or the like, a blade (disk blade) which is rotating at a speed as high as usually 30,000 rpm or higher is used to dice the wafer together with a surface part of a tape (pressure-sensitive adhesive sheet). In this dicing, a surface part of the substrate film is cut while coming into a molten state due to the heat of friction with the blade rotating at a high speed. As shown in FIG. 1, this molten substrate resin is flung up by the blade and then solidifies upon cooling with cutting/cooling water in a dicer, resulting in the generation of a fibrous waste.

According to the present invention, since the substrate film comprises a specific polymer blend as described above, the polymers tend to separate from each other to form microscopic particles, when the substrate resin melts and the molten resin is flung up. This is because the bonding strength between the polymers is low and the polymers differ from each other in melt viscosity, melting point, etc. Thus, the generation of a fibrous waste is significantly inhibited.

Figure 1:
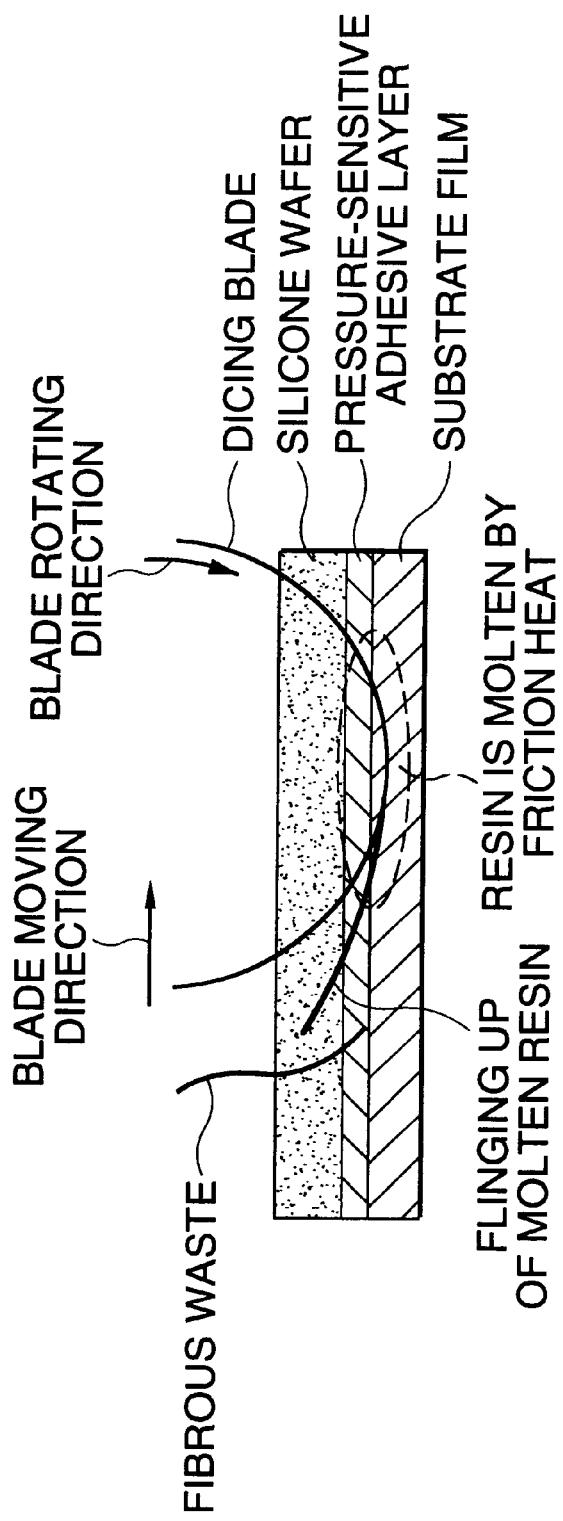
FIG. 1 is an explanatory view showing a cross-section of a pressure-sensitive adhesive sheet in a silicon wafer adhered to the pressure-sensitive adhesive sheet for dicing.

Reference numerals in the drawings are as follows.

1: Pressure-sensitive adhesive sheet for dicing
11: Substrate film
12: Pressure-sensitive adhesive layer
13: Separator

DESCRIPTION OF THE PREFERRED EMBODIMENTS

The present invention will be explained below in more detail by reference to the accompanying drawings.

Figure 2:
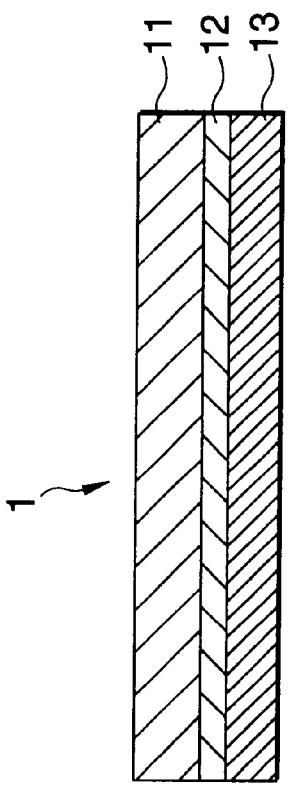
FIG. 2 is a sectional view showing one embodiment of the pressure-sensitive adhesive sheet for dicing according to the present invention.

The pressure-sensitive adhesive sheet for dicing of the present invention comprises a substrate film and a pressure-sensitive adhesive layer formed on at least one side of the substrate film, and optionally further comprises a separator adhered on the pressure-sensitive adhesive layer. FIG. 2 is a schematic sectional view showing one embodiment of the pressure-sensitive adhesive sheet for dicing according to the present invention, in which 11 is a substrate film, 12 is a pressure-sensitive adhesive layer and 13 is a separator.

The substrate film 11 comprises a polymer blend comprising two or more polymers. The polymer blend may have any dispersed state (compatibilized state) of a semi-compatibilized polymer blend (forming a phase diagram) or a non-compatibilized polymer blend. For example, a preferred state is that an appropriate degree of microscopic dispersion or phase separation is observed between the polymers when the polymer blend is examined with an SEM or TEM if desired after a pre-treatment, e.g., dyeing. An especially preferred polymer blend in the present invention is a non-compatibilized polymer blend.

The substrate film 11 preferably is flexible so as to withstand expansion after dicing. Because of this, at least one polymer (hereinafter sometimes referred to as "polymer A") in the polymers constituting the polymer blend is preferably a flexible polymer. Examples of the flexible polymer include low density polyethylene, linear low density polyethylene, a polypropylene random copolymer, a polypropylene block copolymer, an ethylene/vinyl acetate copolymer, an ionomer resin, an ethylene/(meth)acrylic acid copolymer, an ethylene/(meth)acrylic ester (random or alternating) copolymer and a soft polymer of, for example, a crosslinked product obtained from any of those. The polymer A is especially preferably a flexible olefin resin. The polymer A has a crystallinity, as determined by the infrared dichroism method, of preferably lower than 40%, more preferably lower than 35%, from the standpoint of flexibility. The proportion of the polymer A to the whole polymer blend is preferably 50% by weight or higher (e.g., from 50 to 99% by weight), more preferably 60% by weight or higher (e.g., from 60 to 95% by weight).

Another kind of the polymers constituting the polymer blend is not particularly limited as long as it is a polymer capable of forming, in cooperation with the polymer A, a semi- or non-compatibilized polymer blend (hereinafter, this polymer will be sometimes referred to as "polymer B"). Examples of the polymer B include rigid polymers such as medium density polyethylene, high density polyethylene, homopolypropylene, polybutene and polymethylpentene (in particular, rigid olefin resins). This polymer B has a crystallinity (by the infrared dichroism method) of preferably 40% or higher, more preferably 45% or higher. The proportion of the polymer B to the whole polymer blend can be suitably selected as long as expandability is not impaired. The proportion the polymer B is preferably 50% by weight or lower (e.g., from 1 to 50% by weight), more preferably 40% by weight or lower (e.g., from 5 to 40% by weight).

From the standpoint of enhancing the effect of preventing fibrous waste generation, the difference in melting point between the polymer A and the polymer B is preferably 15° C. or larger.

In the case where the polymer blend comprises a lowly crystalline polymer (e.g., a lowly crystalline olefin resin) having a crystallinity lower than 40% and a highly crystalline polymer (e.g., a highly crystalline olefin resin) having a crystallinity of 40% or higher (in the case of the pressure-sensitive adhesive sheet 2), the polymer blend need not necessarily be a semi- or non-compatibilized system and may be a compatibilized system. In this case, the generation of a fibrous waste can be inhibited regardless of the compatibilized state.

The thickness of the substrate film 11 is generally about 10 to 300 $\mu$m, preferably about 30 to 200 $\mu$m. The substrate film 11 can be formed by a conventional film-forming method. For example, two or more polymers serving as the components of the substrate film 11 are blended with each other and the blend is formed into a film by extrusion or another technique to thereby produce the substrate film 11. For blending the polymer, various conventional techniques can be used, such as wet stirring in a heated solvent, e.g., xylene, kneading with a twin-screw extruder or the like, and dry mixing by means of a blender or mixer. For the extrusion, conventional techniques can be used, such as wet casting, film blowing and T-die extrusion.

The substrate film 11 may be either a single-layer film or a multilayer film. The multilayer film is not particularly limited in layer constitution as long as at least a surface part thereof (the layer in contact with the pressure-sensitive adhesive layer) is constituted of the polymer blend described above. This multilayer film can be produced by a conventional film laminating technique such as co-extrusion or dry laminating.

The substrate film 11 may be uniaxially or biaxially stretched according to need. A surface of the substrate film 11 may be subjected to a conventional physical or chemical treatment such as matting treatment, corona discharge treatment or primer treatment according to need.

In the case where the pressure-sensitive adhesive layer 12 comprises a pressure-sensitive adhesive curable with a radiation, e.g., ultraviolet, the substrate film 11 should have sufficient radiation-transmitting properties because the pressure-sensitive adhesive layer 12 is irradiated with a radiation before or after a dicing step.

The pressure-sensitive adhesive layer 12 can comprises a conventional pressure-sensitive adhesive composition. Although such pressure-sensitive adhesives are not limited in any way, examples thereof that can be used include rubber-based, acrylic, silicone and poly(vinyl ether) pressure-sensitive adhesives. It is also possible to use a radiation-curable type or heat-foamable type pressure-sensitive adhesive. Furthermore, a pressure-sensitive adhesive that can be used for both dicing and die bonding may be used. In the present invention, it is especially preferred to use an ultraviolet-curable pressure-sensitive adhesive.

Of the above pressure-sensitive adhesives, homopolymers of (meth)acrylic esters or copolymers of a (meth)acrylic ester and one or more copolymerizable monomers are used as the acrylic pressure-sensitive adhesives. Examples of the monomers or comonomers constituting these copolymers include alkyl esters (e.g., methyl ester, ethyl ester, butyl ester, 2-ethylhexyl ester, octyl ester and isononyl ester) of (meth)acrylic acid, hydroxyalkyl esters (e.g., hydroxyethyl ester, hydroxybutyl ester and hydroxyhexyl ester) of (meth) acrylic acid, glycidyl (meth)acrylate, (meth)acrylic acid, itaconic acid, maleic anhydride, (meth)acrylamide, N-hydroxymethyl(meth)acrylamide, alkylaminoalkyl esters of (meth)acrylic acid (e.g., dimethylaminoethyl methacrylate and t-butylaminoethyl methacrylate), vinyl acetate, styrene and acrylonitrile. The main monomer generally used is an alkyl acrylate which gives a homopolymer having a glass transition point of −50° C. or lower.

The ultraviolet-curable pressure-sensitive adhesive can, for example, comprise a homopolymer of any of the above-described acrylic esters or a copolymer thereof with one or more copolymerizable monomers (acrylic polymer), an ultraviolet-curable ingredient (an ingredient which adds side chains of the acrylic polymer to carbon-carbon double bonds), and a photopolymerization initiator, and optionally further comprises conventional additives such as a crosslinking agent, tackifier, filler, antioxidant and colorant.

The ultraviolet-curable ingredient is not particularly limited as long as it is a monomer, oligomer or polymer, which has one or more carbon-carbon double bonds in the molecule and is curable through radical polymerization. Examples thereof include esters of (meth) acrylic acid with a polyhydric alcohol, such as trimethylolpropane tri(meth)acrylate, pentaerythritol tri(meth)acrylate, tetraethylene glycol di(meth)acrylate, 1,6-hexanediol di(meth)acrylate, neopentyl glycol di(meth)acrylate and dipentaerythritol hexa (meth)acrylate; acrylate oligomers; and isocyanurates or isocyanurate compounds, such as 2-propenyl di-3-butenyl cyanurate, 2-hydroxyethyl bis(2-acryloxyethyl) isocyanurate and tris(2-methacryloxyethyl) isocyanurate. In the case where the acrylic polymer used is an ultraviolet-curable polymer having carbon-carbon double bonds in side chains thereof, there is no particular need of adding the ultraviolet-curable ingredient described above.

The polymerization initiator is not particularly limited as long as it is a substance which cleaves to generate a free radical upon irradiation with ultraviolet rays having an appropriate wavelength and serving as a trigger for the polymerization reaction. Examples of the polymerization initiator include benzoin alkyl ethers such as benzoin methyl ether, benzoin isopropyl ether and benzoin isobutyl ether; aromatic ketones such as benzil, benzoin, benzophenone and α-hydroxycyclohexyl phenyl ketone; aromatic ketals such as benzyl dimethyl ketal; polyvinylbenzophenones; and thioxanthone derivatives such as chlorothioxanthone, dodecylthioxanthone, dimethylthioxanthone and diethylthioxanthone.

Examples of the crosslinking agent include polyisocyanate compounds, melamine resins, urea resins, epoxy resins, acid anhydrides, polyamines and carboxyl-containing polymers.

The thickness of the pressure-sensitive adhesive layer 12 varies depending on the kind of the pressure-sensitive adhesive, but is generally about 1 to 100 μm, preferably about 3 to 50 μm.

The separator 13 is disposed according to need for the purpose of labeling or in order to smooth the surface of the pressure-sensitive adhesive layer. Examples of the constituent material of the separator 13 include paper and films of synthetic resins such as polyethylene, polypropylene and poly(ethylene terephthalate). If necessary, a surface of the separator 13 may be subjected to a release treatment such as a treatment with a silicone, long-chain alkyl type or fluorochemical release agent in order to enhance releasability from the pressure-sensitive adhesive layer 12. The thickness of the separator 13 is generally about 10 to 200 μm, preferably about 25 to 100 μm.

The pressure-sensitive adhesive sheet for dicing of the present invention can be produced by, for example, applying a composition containing a pressure-sensitive adhesive to a surface of a substrate film 11, drying the coating (and optionally crosslinking the adhesive polymer by heating) to form a pressure-sensitive adhesive layer 12, and applying a separator 13 to the surface of this pressure-sensitive adhesive layer 12 according to need.

The pressure-sensitive adhesive sheet for dicing of the present invention can be used as, for example, a pressure-sensitive adhesive sheet for the dicing of silicon semiconductor wafers, a pressure-sensitive adhesive sheet for the dicing of compound semiconductor wafers, a pressure-sensitive adhesive sheet for the dicing of semiconductor packages or a pressure-sensitive adhesive sheet for the dicing of glasses.

According to the present invention, since the substrate film comprises a specific polymer blend, the generation of a fibrous waste during dicing can be inhibited even when the film melts due to the heat of dicing, probably because the constituent resins in the melt separate from each other without growing into a fibrous waste. Thus, the reliability of chips can be improved.

Furthermore, sufficient expandability can also be secured by regulating the proportion of a flexible plastic resin in the constituent resins. Therefore, not only the workability and throughput can be improved, but also the yield is improved because the substrate film is satisfactory in homogeneity including appearance.

The present invention will be explained below in more detail by reference to Examples, but it should be understood that the invention is not construed as being limited thereto.

EXAMPLE 1

A solution containing an acrylic copolymer having a number average molecular weight of 800,000 was obtained by copolymerizing 95 parts by weight of butyl acrylate and 5 parts by weight of acrylic acid in ethyl acetate in the conventional manner. To this solution were added 60 parts by weight of dipentaerythritol hexaacrylate (trade name "Kayarad DPHA"; manufactured by Nippon Kayaku Co., Ltd.), 3 parts by weight of a radical polymerization initiator (trade name "Irgacure 651"; manufactured by Ciba Specialty Chemicals), and 5 parts by weight of a polyisocyanate compound (trade name "Coronate L"; manufactured by Nippon Polyurethane Co., Ltd.) to prepare an acrylic, ultraviolet-curable, pressure-sensitive adhesive solution. This solution was applied to the corona-treated surface of a 100 μm thick substrate film obtained by the following method and then heated at 80° C. for 10 minutes to crosslink the adhesive to thereby form an ultraviolet-curable pressure-sensitive adhesive layer having a thickness of 10 μm. Subsequently, a separator was applied to the surface of the pressure-sensitive adhesive layer to produce an ultraviolet-curable pressure-sensitive adhesive sheet for dicing.

The substrate film was produced by sufficiently blending 70 parts by weight of a low density polyethylene (LDPE) resin (melting point: 110° C.) with 30 parts by weight of a homopolypropylene (HPP) resin (melting point: 160° C.) by means of a dry blender, extrusion-molding the blend with a film blowing machine at an extrusion temperature of 230° C., and then subjecting one side of the blown film to a corona treatment. In this blown film, the crystallinities (by the infrared dichroism method) of the low density polyethylene and the homopolypropylene were 10% and 65%, respectively. A section of the substrate film was examined with a TEM. As a result, phase separation was observed between the resins.

EXAMPLE 2

Sixty parts by weight of a random polypropylene (RPP) resin (melting point: 140° C.) was sufficiently dry-blended with 30 parts by weight of a high density polyethylene (HDPE) resin (melting point: 135° C.) and 10 parts by weight of an ethylene/propylene rubber (EPR) by means of a blender. The blend was kneaded with a twin-screw extruder and then pelletized. An ultraviolet-curable pressure-sensitive adhesive sheet for dicing was obtained in the same manner as in Example 1, except that the resin pellets prepared above were extruded with a T-die extruder at 210° C. to obtain a substrate film. In this substrate film, the crystallinities (by the infrared dichroism method) of the random polypropylene and the high density polyethylene were 15% and 45%, respectively. A section of the substrate film was examined with a TEM. As a result, phase separation was observed between the resins.

EXAMPLE 3

Seventy parts by weight of an ethylene/methacrylic acid copolymer (EMAA) resin (melting point: 95° C.) was sufficiently dry-blended with 10 parts by weight of an ethylene/propylene rubber (EPR) and 20 parts by weight of a homopolypropylene (HPP) resin (melting point: 160° C.) by means of a blender. The blend was kneaded with a twin-screw extruder and then pelletized. An ultraviolet-curable pressure-sensitive adhesive sheet for dicing was obtained in the same manner as in Example 1, except that the resin pellets prepared above were extruded with a T-die extruder at 200° C. to obtain a substrate film. In this substrate film, the crystallinities (by the infrared dichroism method) of the ethylene/methacrylic acid copolymer and the polypropylene wax were 25% and 70%, respectively. A section of the substrate film was examined with a TEM. As a result, phase separation was observed between the resins.

EXAMPLE 4

A pressure-sensitive adhesive sheet for dicing was obtained in the same manner as in Example 1, except that an acrylic pressure-sensitive adhesive solution was prepared by adding 5 parts by weight of a polyisocyanate compound (trade name "Coronate L"; manufactured by Nippon Polyurethane Co., Ltd.) to a solution which contained an acrylic copolymer having a number average molecular weight of 800,000 and had been obtained by copolymerizing 95 parts by weight of butyl acrylate and 5 parts by weight of acrylic acid in ethyl acetate in the conventional manner.

Comparative Example 1

An ultraviolet-curable pressure-sensitive adhesive sheet for dicing was obtained in the same manner as in Example 1, except that a low density polyethylene (LDPE) film was used as a substrate film. This low density polyethylene film had a crystallinity (by the infrared dichroism method) of 10%.

Comparative Example 2

An ultraviolet-curable pressure-sensitive adhesive sheet for dicing was obtained in the same manner as in Example 1, except that an ethylene/acrylic acid copolymer (EMAA) film was used as a substrate film. This ethylene/acrylic acid copolymer film had a crystallinity (by the infrared dichroism method) of 25%.

Comparative Example 3

An ultraviolet-curable pressure-sensitive adhesive sheet for dicing was obtained in the same manner as in Example 1, except that a homopolypropylene (HPP) film (melting point, 160° C.) was used as a substrate film.

Comparative Example 4

A pressure-sensitive adhesive sheet for dicing was obtained in the same manner as in Comparative Example 1, except that the pressure-sensitive adhesive shown in Example 4 was used.

Evaluation Tests

The pressure-sensitive adhesive sheets for dicing obtained in the Examples and Comparative Examples were evaluated by the following methods.

(1) Evaluation of Suitability for Dicing

A 6 inch wafer having a thickness of 350 μm was mounted on each of the pressure-sensitive adhesive sheets for dicing, and then diced under the following conditions. Dicing Conditions:

Dicer: DFD-651, manufactured by DISCO

Blade: 27HECG, manufactured by DISCO

Blade rotational speed: 40,000 rpm

Dicing rate: 100 mm/sec

Dicing depth: 30 μm from tape surface

Blade thickness: 50 μm

Dicing size: 5 mm×5 mm

Cutting mode: down cutting

After dicing, the pressure-sensitive adhesive sheet was irradiated with ultraviolet (450 mJ/cm$^2$) when it was of the ultraviolet-curable type. Subsequently, the semiconductor chips were peeled off, and the exposed sheet surface was examined with an optical microscope (magnification: 200) for fibrous wastes present thereon. The fibrous wastes were classified by size in groups and counted with respect to each group. The results obtained are shown in Table 1 below.

TABLE 1

| | Blend composition for substrate film | Suitability for dicing Number of fibrous wastes | | |
| --- | --- | --- | --- | --- |
| | | Shorter than 100 μm | 100–500 μm | Exceeding 500 μm |
| Example 1 | LDPE/HPP = 70/30 | 10 | 2 | 0 |
| Example 2 | RPP/HDPE/EPR = 60/30/10 | 26 | 4 | 0 |
| Example 3 | EMAA/EPR/HPP = 70/10/20 | 21 | 3 | 0 |
| Example 4 | LDPE/HPP = 70/30 | 13 | 1 | 0 |
| Comparative Example 1 | LDPE = 100 | ≧100 | ≧100 | 94 |

TABLE 1-continued

| Blend composition for substrate film | Suitability for dicing Number of fibrous wastes | | |
|---|---|---|---|
| | Shorter than 100 μm | 100–500 μm | Exceeding 500 μm |
| Comparative Example 2 | EMAA = 100 | ≧100 | 82 | 88 |
| Comparative Example 3 | HPP = 100 | 0 | 0 | 0 |
| Comparative Example 4 | LDPE = 100 | ≧100 | 87 | 91 |

(2) Evaluation of Expandability

A 6 inch wafer was mounted on each pressure-sensitive adhesive sheet and diced in the same manner as in the evaluation of suitability for dicing. The sheet was then expanded by pulling down the fixing ring with a die bonder (CPS-100, manufactured by Nichiden Kikai) by 10 mm. Whether the sheet which had undergone this expanding operation was in a sufficiently expanded state or not was visually ascertained. In the case of an ultraviolet-curable pressure-sensitive adhesive sheet, the expandability thereof was also evaluated after it was irradiated with ultraviolet ray (460 mJ/cm$^2$). The results obtained are shown in Table 2 below.

TABLE 2

| | Blend composition for substrate film | Expandability, pulling-down distance, 10 mm | |
|---|---|---|---|
| | | Before UV | After UV |
| Example 1 | LDPE/HPP = 70/30 | good | good |
| Example 2 | RPP/HDPE/EPR = 60/30/10 | good | good |
| Example 3 | EMAA/EPR/HPP = 70/10/20 | good | good |
| Example 4 | LDPE/HPP = 70/30 | good | — |
| Comparative Example 1 | LDPE = 100 | good | good |
| Comparative Example 2 | EMAA = 100 | good | good |
| Comparative Example 3 | HPP = 100 | good | tore |
| Comparative Example 4 | LDPE = 100 | good | — |

What is claimed is:

1. A pressure-sensitive adhesive sheet for dicing which comprises a substrate film and formed thereon a pressure-sensitive adhesive layer for adhesively fixing a material to be diced, wherein said substrate film has a single- or multilayer structure and at least a layer in the substrate film, that contacts the pressure-sensitive adhesive layer comprises semi- or non-compatibilized polymer blend comprising two or more polymers, wherein at least one of the polymers constituting the polymer blend is a highly crystalline olefin resin having a crystallinity of 40% or higher and the content of this polymer in the polymer blend is 1 to 50% by weight based on the weight of the polymer blend.

2. The pressure-sensitive adhesive sheet for dicing as claimed in claim 1, wherein the pressure-sensitive adhesive layer is a radiation-curable pressure-sensitive adhesive layer.

3. A pressure-sensitive adhesive sheet for dicing which comprises a substrate film and formed thereon a pressure-sensitive adhesive layer for adhesively fixing a material to be diced, wherein said substrate film has a single- or multilayer structure and at least the layer in the substrate film, that contacts the pressure-sensitive adhesive layer comprises a polymer blend comprising a crystalline polymer having a crystallinity lower than 40% and a highly crystalline polymer having a crystallinity of 40% or higher.

4. The pressure-sensitive adhesive sheet for dicing as claimed in claim 3, wherein the contents of the crystalline polymer and the highly crystalline polymer in the polymer blend are 50 to 99% by weight and 1 to 50% by weight, based on the weight of the polymer blend, respectively.

5. The pressure-sensitive adhesive sheet for dicing as claimed in claim 4, wherein the pressure-sensitive adhesive layer is a radiation-curable pressure-sensitive adhesive layer.

6. A pressure-sensitive adhesive sheet for dicing which comprises a substrate film and formed thereon a pressure-sensitive adhesive layer for adhesively fixing a material to be diced, wherein said substrate film has a single- or multilayer structure and at least a layer in the substrate film, that contacts the pressure-sensitive adhesive layer comprises semi- or non-compatibilized polymer blend comprising two or more polymers, wherein at least one of the polymers constituting the polymer blend is a crystalline olefin resin having a crystallinity lower than 40% and the content of this polymer in the polymer blend is from 50 to 99% by weight.

7. A pressure-sensitive adhesive sheet for dicing which comprises a substrate film and formed thereon a pressure-sensitive adhesive layer for adhesively fixing a material to be diced, wherein said substrate film has a single- or multilayer structure and at least a layer in the substrate film, that contacts the pressure-sensitive adhesive layer comprises semi- or non-compatibilized polymer blend comprising two or more polymers, wherein at least one of the polymers constituting the polymer blend is a highly crystalline olefin resin having a crystallinity of 40% or higher and the content of this polymer in the polymer blend is 1 to 50% by weight based on the weight of the polymer blend, and wherein at least one of the polymers constituting the polymer blend is a crystalline olefin resin having a crystallinity lower than 40% and the content of this polymer in the polymer blend is from 50 to 99% by weight.

8. The pressure-sensitive adhesive sheet for dicing as claimed in claim 6, wherein the pressure-sensitive adhesive layer is a radiation-curable pressure-sensitive adhesive layer.

9. A dicing method comprising dicing a semiconductor wafer while the semiconductor wafer is mounted on the pressure-sensitive adhesive sheet as claimed in claim 1.

10. A semiconductor element obtained by the dicing method as claimed in claim 9.

* * * * *